(12) United States Patent
Huang et al.

(10) Patent No.: US 9,048,388 B2
(45) Date of Patent: Jun. 2, 2015

(54) MULTI-LAYER THERMOELECTRIC MODULE AND METHOD FOR FABRICATING THE SAME

(71) Applicant: CHINA STEEL CORPORATION, Kaohsiung (TW)

(72) Inventors: Jing-Yi Huang, Kaohsiung (TW); Huey-Lin Hsieh, Tainan (TW); Tung-Han Chuang, Taipei (TW); Jenn-Dong Hwang, Hsinchu (TW); Chao-Chi Jain, Nantou (TW)

(73) Assignee: CHINA STEEL CORPORATION, Kaohsiung (TW)

( * ) Notice: Subject to any disclaimer, the term of this patent is extended or adjusted under 35 U.S.C. 154(b) by 107 days.

(21) Appl. No.: 13/937,183

(22) Filed: Jul. 8, 2013

(65) Prior Publication Data
US 2014/0305483 A1 Oct. 16, 2014

(30) Foreign Application Priority Data
Apr. 10, 2013 (TW) .............................. 102112719 U

(51) Int. Cl.
*H01L 35/32* (2006.01)
*H01L 35/34* (2006.01)

(52) U.S. Cl.
CPC .............. *H01L 35/325* (2013.01); *H01L 35/34* (2013.01)

(58) Field of Classification Search
CPC ........ H01L 35/32; H01L 35/325; H01L 35/34
USPC .......................................... 136/202, 238, 239
See application file for complete search history.

(56) References Cited

U.S. PATENT DOCUMENTS 3,666,566 A * 5/1972 Paine ............................ 136/202

* cited by examiner

*Primary Examiner* — Jayne Mershon
(74) *Attorney, Agent, or Firm* — CKC & Partners Co., Ltd.

(57) ABSTRACT

A multi-layer thermoelectric module and a fabricating method thereof are provided. The module includes two thermoelectric element sets and a metal electrode set, in which the thermoelectric element sets are corresponding to different operating temperature ranges. Each thermoelectric element set includes a thermoelectric unit, an interfacial adhesion layer, a diffusion barrier layer and a high melting-point metal layer. In the method, the thermoelectric unit, the interfacial adhesion layer, and the diffusion barrier layer are sequentially formed on the thermoelectric unit. Then, two high melting-point metal layers are formed respectively on the electrode layers of the metal electrode set. Thereafter, a solid-liquid interdiffusion jointing step is conducted to use a low melting-point metal layer to react with the high melting-point metal layer for producing an intermetallic compound layer jointing the thermoelectric element set with the metal electrode set, and the low melting-point metal layer is consumed completely.

6 Claims, 12 Drawing Sheets

MULTI-LAYER THERMOELECTRIC MODULE AND METHOD FOR FABRICATING THE SAME

RELATED APPLICATIONS

This application claims priority to Taiwan Application Serial Number 102112719, filed Apr. 10, 2013, which is herein incorporated by reference.

BACKGROUND

1. Field of Invention

The present invention relates to a multi-layer thermoelectric module and a fabrication method thereof. More particularly, the present invention relates to a multi-layer thermoelectric module and a method for fabricating the multi-layer thermoelectric module using a solid-liquid interdiffusion jointing technique.

2. Description of Related Art

A thermoelectric material may use a temperature difference to generate electric current, generate electricity by recycling waste heat, or use electric current to cause temperature difference for achieving an object of active cooling for heat dissipation, which is of special meaning to the topics in modern electronics, energy and environmental protection.

However, a method for fabricating a conventional monolayer or multi-layer thermoelectric module often adopts a low melting-point solder alloy soldering technique, or a high melting-point filler alloy brazing technique, in which a process temperature of the soldering method is relatively low, and an operating temperature of the fabricated thermoelectric module cannot be higher than the melting point of the solder alloy. Generally speaking, some moderate or low temperature thermoelectric materials have the most efficient thermoelectric conversion efficiency temperature which is already higher than the melting points of common solder alloys. Therefore, the soldering method is completely not applicable to the fabrication of thermoelectric module.

Besides, the filler alloy used by the brazing method for fabricating a thermoelectric module has a higher melting point. In the fabricated thermoelectric module, the brazed points can sustain a higher operating temperature, but the process temperature is also higher, in which the thermal stress generated therein may damage the thermoelectric module or cause thermoelectric material to fail.

Furthermore, when fabricating the multi-layer thermoelectric module of two or three layers, the conventional soldering or brazing technique also faces another problem, which is, when a second layer of thermoelectric module is fabricated after a first layer of thermoelectric module is completed, the solder-joint alloy or the brazing filler alloy of the first layer of thermoelectric module is melted to cause the joint surface to be detached or displaced. In order to solve the problem, in one method, the first layer of thermoelectric module may be fabricated by a brazing method, and the second layer of thermoelectric module may be fabricated by another brazing method with a lower process temperature or by using another solder alloy of which the melting point is lower than the temperature for fabricating the first layer of thermoelectric module. However, this method may result in the problem of low production efficiency. Another method is to joint two or three layers of thermoelectric unit with a metal electrode at one single temperature to form a multi-layer thermoelectric module, but the method has a high risk of failure, thus resulting in a low yield of the thermoelectric module process.

In view of this, there is a need to provide a multi-layer thermoelectric module and a method for fabricating the multi-layer thermoelectric module to improve the defects of the conventional thermoelectric module and a method of connecting a thermoelectric unit to a metal electrode.

SUMMARY

In view of the above problem, an aspect of the present invention is to provide a multi-layer thermoelectric module and a method for fabricating the multi-layer thermoelectric module, so as to solve the problem of difficult process or thermal stress caused by a multi-layer thermoelectric module fabricated by the conventional soldering or brazing method.

According to some embodiments, the multi-layer thermoelectric module includes a first thermoelectric element set, a second thermoelectric element set, a metal electrode set, a first intermetallic compound layer and a second intermetallic compound layer.

The first thermoelectric element set includes a first thermoelectric unit, a first interfacial adhesion layer, a first diffusion barrier layer and a first high melting-point metal layer. The first thermoelectric unit is corresponding to a first operating temperature range. The first interfacial adhesion layer is formed on a surface of the first thermoelectric unit. The first diffusion barrier layer is formed on a surface of the first interfacial adhesion layer. The first high melting-point metal layer formed on a surface of the first diffusion barrier layer, in which a melting point of the first high melting-point metal layer is higher than an upper limit of the first operating temperature range.

Further, the second thermoelectric element set includes a second thermoelectric unit, a second interfacial adhesion layer, a second diffusion barrier layer and a second high melting-point metal layer. The second thermoelectric unit is corresponding to a second operating temperature range, in which an upper limit of the second operating temperature range is smaller than the upper limit of the first operating temperature range. The second interfacial adhesion layer is formed on a surface of the second thermoelectric unit. The second diffusion barrier layer is formed on a surface of the second interfacial adhesion layer. The second high melting-point metal layer is formed on a surface of the second diffusion barrier layer, in which a melting point of the second high melting-point metal layer is higher than the upper limit of the first operating temperature range.

Further, in some embodiments, the multi-layer thermoelectric module further includes a third high melting-point metal layer and a fourth high melting-point metal layer. The third high melting-point metal layer and the fourth high melting-point metal layer are respectively disposed on an upper surface and a lower surface of the metal electrode set. The first intermetallic compound layer is formed between the third high melting-point metal layer and the first high melting-point metal layer of the first thermoelectric element set for jointing the first thermoelectric element set with the metal electrode set; and the second intermetallic compound layer is formed between the fourth high melting-point metal layer and the second high melting-point metal layer of the second thermoelectric element set for jointing the second thermoelectric element set with the metal electrode set.

According to some embodiments, the present invention provides a method for fabricating a multi-layer thermoelectric module. In the method for fabricating a multi-layer thermoelectric module, at first, a metal electrode set is provided. Then, a first fabricating step is conducted for fabricating a first thermoelectric element set, in which the first fabricating step includes: providing a first thermoelectric unit, in which the first thermoelectric unit is corresponding to a first operating temperature range; forming a first interfacial adhesion layer on the first thermoelectric unit; forming a first diffusion barrier layer on the first interfacial adhesion layer; and forming a first high melting-point metal layer on the first diffusion barrier layer for forming the first thermoelectric element set, in which a melting point of the first high melting-point metal layer is higher than an upper limit of the first operating temperature range.

After the first fabricating step, then a second fabricating step is conducted for fabricating a second thermoelectric element set. In the second fabricating step, at first, a second thermoelectric unit is provided, in which the second thermoelectric unit is corresponding to a second operating temperature range, and an upper limit of the second operating temperature range is smaller than the upper limit of the first operating temperature range. Then, a second interfacial adhesion layer is formed on the second thermoelectric unit. Thereafter, a second interfacial adhesion layer is formed on the second interfacial adhesion layer. Then, a second high melting-point metal layer is formed on the second diffusion barrier layer for forming the second thermoelectric element set, in which a melting point of the second high melting-point metal layer is higher than the upper limit of the first operating temperature range.

After the second fabricating step, then an electrode joint step is conducted for the first thermoelectric element set and the second thermoelectric element set jointing respectively with the metal electrode set. In the electrode joint step, at first, a third high melting-point metal layer is formed on an upper surface of the metal electrode set. Then, a fourth high melting-point metal layer is formed on a lower surface of the metal electrode set. Then, a solid-liquid jointing step is conducted for jointing the first high melting-point metal layer of the first thermoelectric element set with the third high melting-point metal layer and jointing the second high melting-point metal layer of the second thermoelectric element set with the fourth high melting-point metal layer. In the solid-liquid jointing step, at first, a first low melting-point metal layer is utilized to react with the first high melting-point metal layer and the third high melting-point metal layer for producing a first intermetallic compound layer to joint the first high melting-point metal layer with the third high melting-point metal layer. The first low melting-point metal layer is consumed completely, in which a melting point of the first low melting-point metal layer is lower than the upper limit of the first operating temperature range. Thereafter, a second low melting-point metal layer is utilized to react with the second high melting-point metal layer and the fourth high melting-point metal layer for producing a second intermetallic compound layer to joint the second high melting-point metal layer with the fourth high melting-point metal layer. The second low melting-point metal layer is consumed completely, in which the melting point of the second low melting-point metal layer is lower than the upper limit of the first operating temperature range.

Therefore, one of the advantages of the present invention is to provide a multi-layer thermoelectric module and a method for fabricating the multi-layer thermoelectric module. The present invention utilizes the intermetallic compound layer to joint two adjacent high melting-point metal layers for connecting the thermoelectric element set and a metal electrode of the metal electrode set, in which the intermetallic compound layer has a higher melting point, thereby the multi-layer thermoelectric module is applicable at a higher temperature range. Therefore, the application of the multi-layer thermoelectric module can be improved.

BRIEF DESCRIPTION OF THE DRAWINGS

These and other features, aspects, and advantages of the present invention will become better understood with regard to the following description, appended claims, and accompanying drawings where:

DETAILED DESCRIPTION

Reference will now be made in detail to the present embodiments of the invention. However, it can be understood that embodiments provides many applicable invention concepts, which can be implemented in specific features of various types. The specific embodiments discussed merely descriptions and are not intended to be limiting the scope of the present invention.

Figure 1:
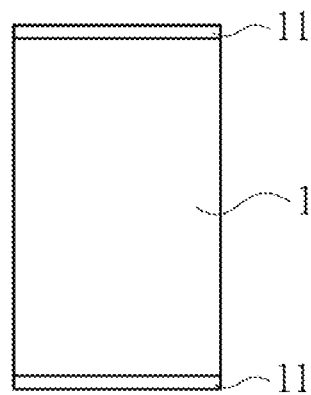
FIG. 1-FIG. 8 are schematic structural diagrams showing a multi-layer thermoelectric module in a fabricating process in accordance with a first embodiment of the present invention.
Figure 2:
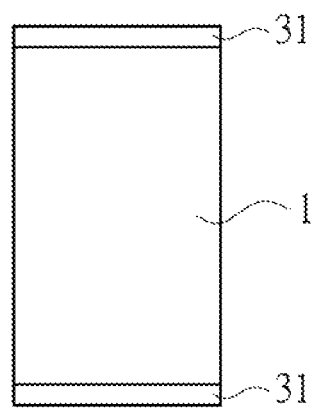

Referring to FIG. 1-FIG. 8, FIG. 1-FIG. 8 are respective schematic structural diagrams showing a multi-layer thermoelectric module in a fabricating process in accordance with a first embodiment of the present invention. As shown in FIG. 1, at first, a metal layer 11 is formed or deposited on a surface of a thermoelectric unit 1. In the present embodiment, the metal layer 11 is formed from Sn, but embodiments of the present invention are not limited thereto. The thickness of the metal layer 11 can be about between 1-3 μm. Then, the metal layer 11 is heated to about 250-400° C. for about 1-10 minutes. As shown in FIG. 2, an interfacial adhesion layer 31 is formed on a surface of the thermoelectric unit 1, in which the interfacial adhesion layer 31 is a compound formed from the metal layer 11 reacted with a portion of the thermoelectric unit 1. For example, if the thermoelectric unit 1 is formed from BiTe and the metal layer 11 is formed from Sn, the interfacial adhesion layer 31 produced will be formed mainly from SnTe with the addition of other doping elements.

Then, referring to FIG. 3, a diffusion barrier layer 32, a high melting-point metal layer 33 and a low melting-point metal layer 34 are sequentially formed on the interfacial adhesion layer 31, in which the diffusion barrier layer 32 is mainly used to prevent the high melting-point metal layer 33 or subsequently connected metal electrodes from diffusing towards the thermoelectric unit 1, or to prevent the interfacial adhesion layer 31 from diffusing towards the high melting-point metal layer 33. The diffusion barrier layer 32 can be formed from Sn, In or Indium-Tin alloy. The thickness of the diffusion barrier layer 32 can be about 2-5 μm. It is noted that a melting point of the high melting-point metal layer 33 is higher than an upper limit of the first operating temperature range.

Figure 4:
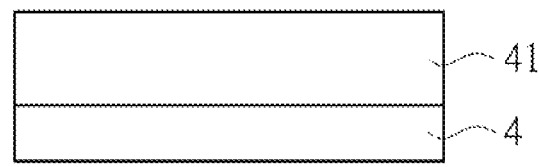
Figure 5:
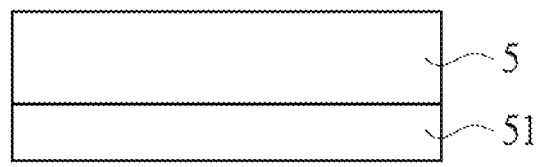
Figure 6:
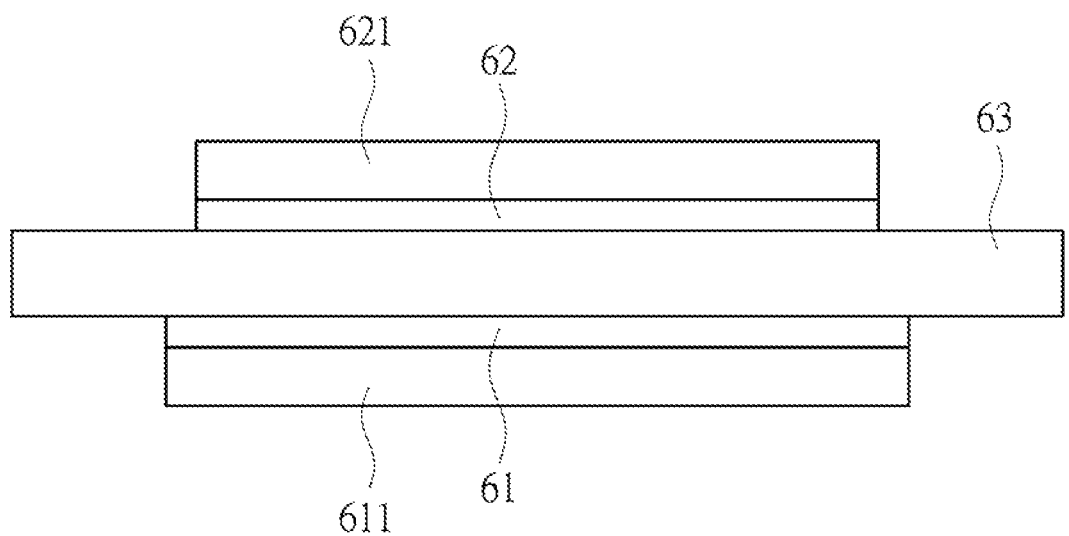

Referring to FIG. 4-FIG. 6, the high melting-point metal layers 41 and 51 are respectively formed on an upper surface of a metal electrode 4 and a lower surface of a metal electrode 5. Further, a metal electrode set includes metal electrodes 61 and 62 and an insulating substrate 63, in which the insulating substrate 63 has an upper surface and a lower surface, and the metal electrodes 61 and 62 are disposed on the lower surface and the upper surface of the insulating substrate 63 respectively. High melting-point metal layers 611 and 612 are respectively disposed on the surfaces of the metal electrodes 61 and 62. Preferably, the thickness of the high melting-point metal layer 41, 51, 611 or 621 can be about between 5-10 µm, and the material forming the high melting-point metal layers 41, 51, 611 and 621 is Ag.

Figure 3:
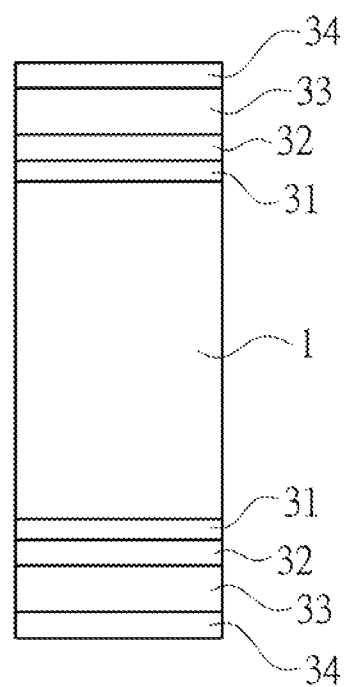
Figure 7:
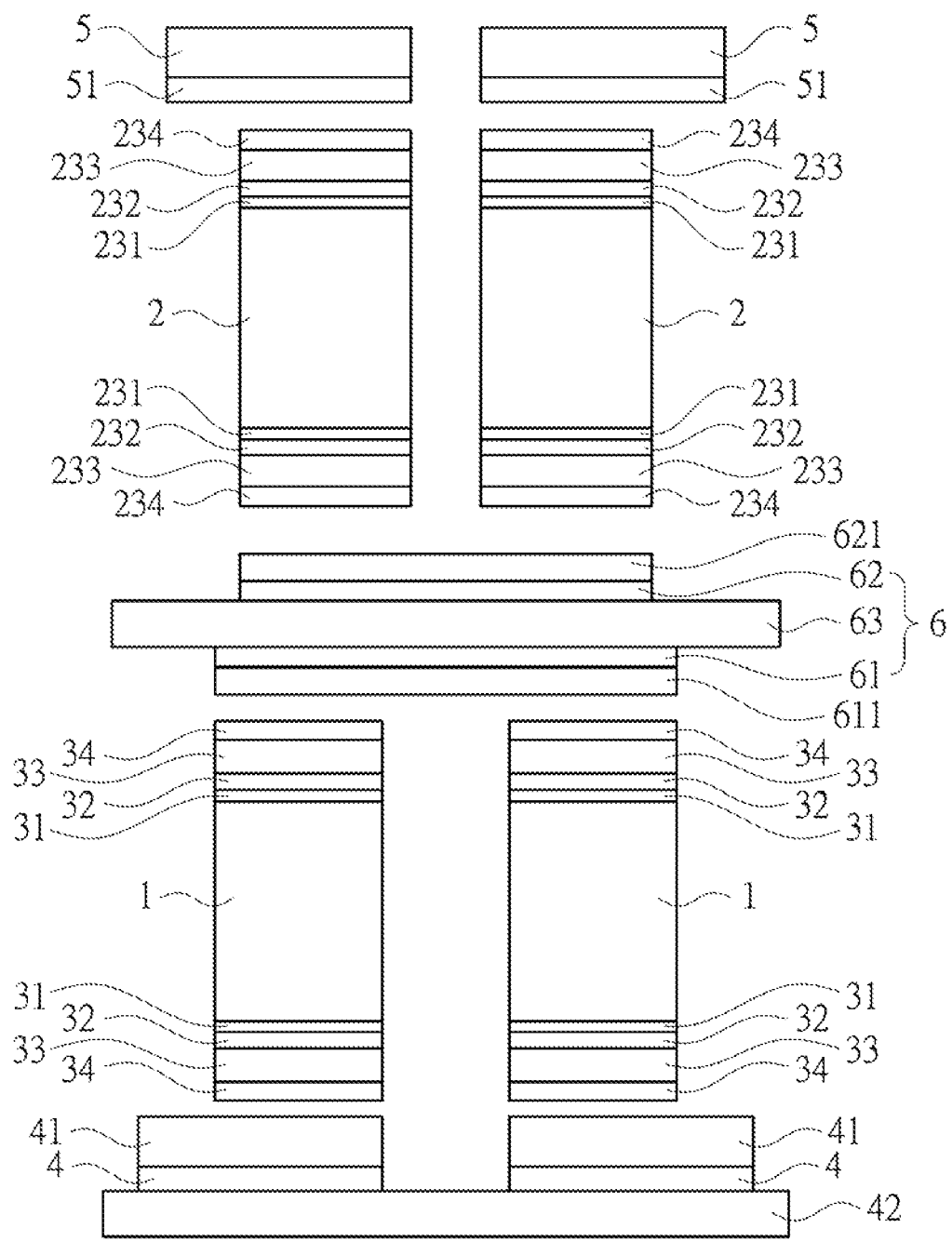

Referring to FIG. 7, as shown in FIG. 1-FIG. 3, an interfacial adhesion layer 231, a diffusion barrier layer 232, a high melting-point metal layer 233 and a low melting-point metal layer 234 are sequentially formed on a surface of another thermoelectric unit 2. The selected materials, thickness or forming methods of the interfacial adhesion layer 231, the diffusion barrier layer 232, the high melting-point metal layer 233 and the low melting-point metal layer 234 can refer to the descriptions regarding the interfacial adhesion layer 31, the diffusion barrier layer 32, the high melting-point metal layer 33 and the low melting-point metal layer 34, and thus are not described again herein. Further, in the first embodiment, two sets of the thermoelectric units 1 and two sets of the thermoelectric units 2 are simultaneously used. However, in some embodiments, the multi-layer thermoelectric module may be formed using only one set of the thermoelectric unit 1 and one set of the thermoelectric unit 2 also can be used.

Thereafter, the metal electrode 4, the thermoelectric unit 1, the metal electrode set 6, the thermoelectric unit 2 and the metal electrode 5 are sequentially arranged in a multi-layer manner. In the first embodiment, two sets of the metal electrodes 5 corresponding to two sets of the thermoelectric units 2 may be used. The high melting-point metal layer 51 of the metal electrode 5 contacts the low melting-point metal layer 234 above the thermoelectric unit 2. Further, the low melting-point metal layer 234 under the thermoelectric unit 2 contacts the high melting-point metal layer 621 of the metal electrode 62, and the high melting-point metal layer 611 of the metal electrode 61 contacts the low melting-point metal layer 34 under two sets of the thermoelectric units 1. Further, in the first embodiment, two sets of the metal electrodes 4 respectively corresponding to two sets of the thermoelectric units 1 may be used, in which the low melting-point metal layers 34 under two sets of the thermoelectric units 1 contacts the high melting-point metal layers 41 above the metal electrode 4. In addition, two sets of the metal electrodes 4 may be formed on the insulating substrate 42.

Figure 8:
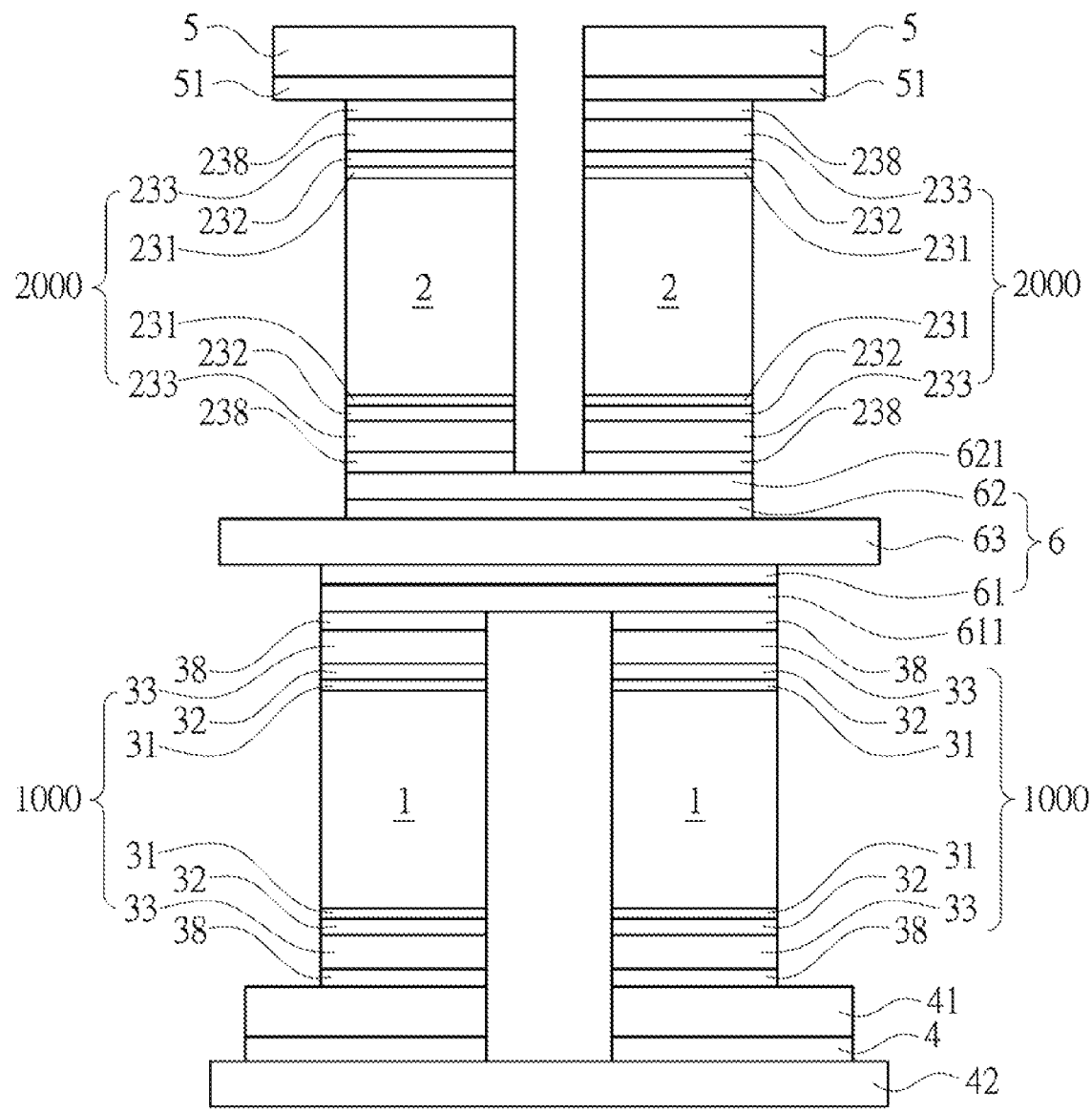

After the aforementioned multi-layer arrangement, a heating step is conducted under vacuum or a protective atmosphere, in which the heating temperature can be about between 150-400° C., the heating time can be about between 3-60 minutes, and the jointing pressure can be about between 3-20 to MPa. After the heating step, each low melting-point metal layer 34 or 234 will be reacted respectively with its contacting high melting-point metal layers 33, 41, and 611 so as to form an intermetallic compound layer 38. Each low melting-point metal layer 234 will be reacted with its contacting high melting-point metal layers 51, 233 and 621 so as to form an intermetallic compound layer 238. For example, if the high melting-point metal layer 33, 41, 51, 233, 611 or 621 is formed from Ag and the low melting-point metal layer 34 or 234 is formed from In or Sn, the intermetallic compound layer 38 or 238 produced can be formed from intermetallic compounds of $Ag_2In$ and $Ag_3In$, or those of $Ag_3Sn$ and $Ag_5Sn$ in accordance with different reaction times and temperatures, in which melting points of $Ag_2In$, $Ag_3In$, $Ag_3Sn$ and $Ag_5Sn$ are approximately 300° C., 660° C., 480° C. and 724° C. In other words, as shown in FIG. 8, after the heating step, the metal electrodes 4 and 61 are connected to the thermoelectric unit 1 by forming the intermetallic compound layer 38 and the metal electrodes 5 and 62 are connected to the thermoelectric unit 2 by forming the intermetallic compound layers 238, so as to form the multi-layer thermoelectric module of the embodiment. The multi-layer thermoelectric module may include thermoelectric element sets 1000 and 2000, the metal electrode set 6, the high melting-point metal layers 611 and 621, and the intermetallic compound layers 38 and 238. The thermoelectric element set 1000 includes the thermoelectric unit 1, the interfacial adhesion layer 31, the diffusion barrier layer 32 and the high melting-point metal layer 33; and the thermoelectric element set 2000 includes the thermoelectric unit 2, the interfacial adhesion layer 231, the diffusion barrier layer 232 and the high melting-point metal layer 233.

In the first embodiment, the melting point of the intermetallic compound layer 38 or 238 is higher than that of the low melting-point metal layer 34 or 234. For example, when the low melting-point metal layers 34 and 234 are formed from Sn or In, the melting points thereof are approximately 232° C. or 156.6° C. Therefore, if the low melting-point metal layers 34 are heated to melt into a liquid phase for conducting a solid-liquid jointing reaction with the solid high melting-point metal layers 33, 41 and 611; and the low melting-point metal layers 234 are heated to melt into a liquid phase for conducting a solid-liquid jointing reaction with the solid high melting-point metal layers 51, 233 and 621, the heating temperature can be chosen to be lower approximately 400° C. and higher than the melting point temperature of the low melting-point metal layer 34 or 234. However, the fabricated intermetallic compound layer 38 or 238 can sustain the temperature between 400° C.-700° C. That is, the intermetallic compound layer 38 or 238 is not melted between about 400° C.-700° C. In other words, in the multi-layer thermoelectric module of the embodiment, although the temperature below 400° C. is used for jointing the high melting-point metal layers 33, 41 and 611 formed respectively on the thermoelectric unit 1, the metal electrodes 4 and 61; and jointing the high melting-point metal layers 51, 233 and 621 formed respectively on the thermoelectric unit 2, the metal electrodes 5 and 62, the intermetallic compound layers 38 and 238 formed respectively from the low melting-point metal layers 34 and 234 can sustain between about 400° C.-700° C. Therefore, the multi-layer thermoelectric module of the embodiment has the feature of low temperature heating for solid-liquid jointing the thermoelectric units 1 and 2, the metal electrodes 4 and 5 and the metal electrode set 6, and can be used at a high temperature. Preferably, the low melting-point metal layer 34 or 234 is completely consumed during the heating step. Therefore, when the multi-layer thermoelectric modules of the embodiments are operated subsequently, the problem of the low melting-point metal layers 34 and 234 melted at a low temperature will not occur. More specifically, the multi-layer thermoelectric module of the embodiments not only can be used at a high temperature range so as to promote an applicable temperature range, but also can be formed at a low temperature so as to reduce the thermal stress problem caused by the thermoelectric unit when the multi-layer thermoelectric module is fabricated.

Figure 9:
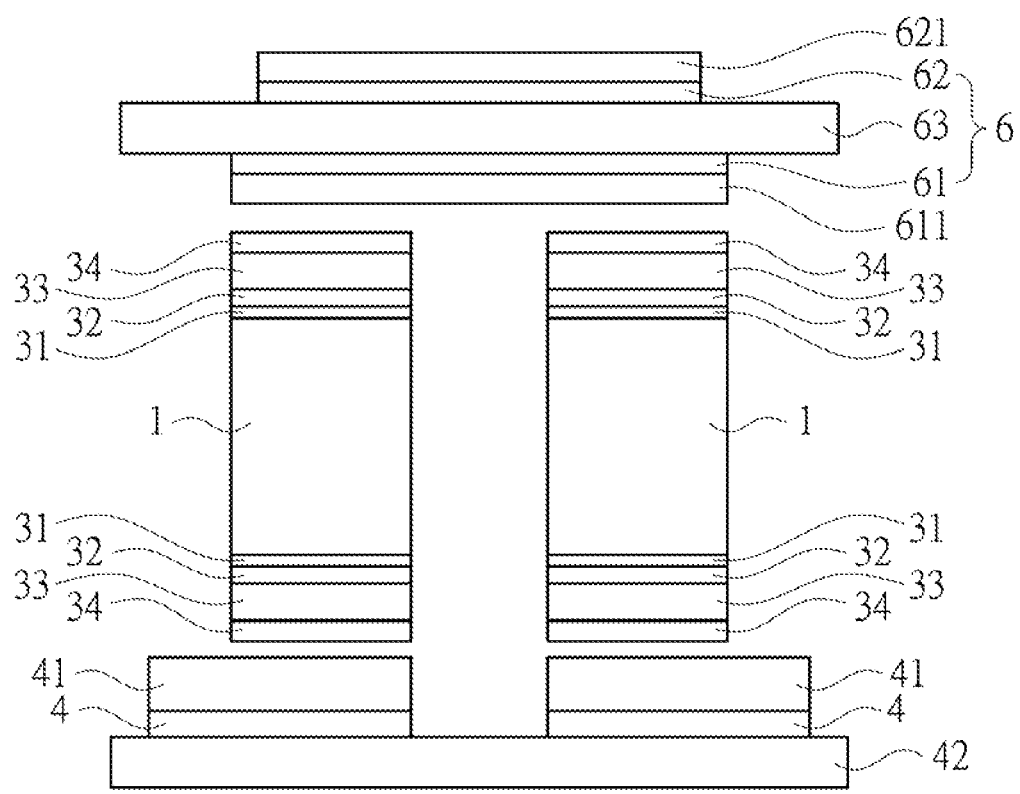
FIG. 9-FIG. 12 are schematic structural diagrams showing a multi-layer thermoelectric module in a fabricating process in accordance with a second embodiment of the present invention.

Further, if the low melting-point metal layer 34 or 234 is consumed completely, the multi-layer thermoelectric modules of the embodiments can be formed in several steps advantageously. In detail, FIG. 9-FIG. 12 are respective schematic structural diagrams showing a fabricating process of a multi-layer thermoelectric module in accordance with a second embodiment of the present invention. At first, as shown in FIG. 9, two thermoelectric units 1, two metal electrodes 4 and a metal electrode set 6 are provided, in which the metal electrode set 6 includes a metal electrode 62 disposed on an upper surface of the metal electrode set 6 and a metal electrode 61 disposed on an lower surface of the metal electrode set 6. An interfacial adhesion layer 31, a diffusion barrier layer 32, a high melting-point metal layer 33 and a low melting-point metal layer 34 are formed sequentially on the surface of each thermoelectric unit 1. High melting-point metal layers 41, 611 and 621 are formed respectively on an upper surface of the metal electrode 4, a lower surface of the metal electrode 61 and the upper surface of the metal electrode 62. Then, the metal electrode set 6, the thermoelectric unit 1 and the metal electrode 4 are sequentially arranged in a multi-layer manner. Then, the high melting-point metal layer 611 contacts the low melting-point metal layer 34 above the thermoelectric unit 1, and the low melting-point metal layer 34 under each thermoelectric unit 1 contacts the high melting-point metal layer 41 above each metal electrode 4.

Figure 10:
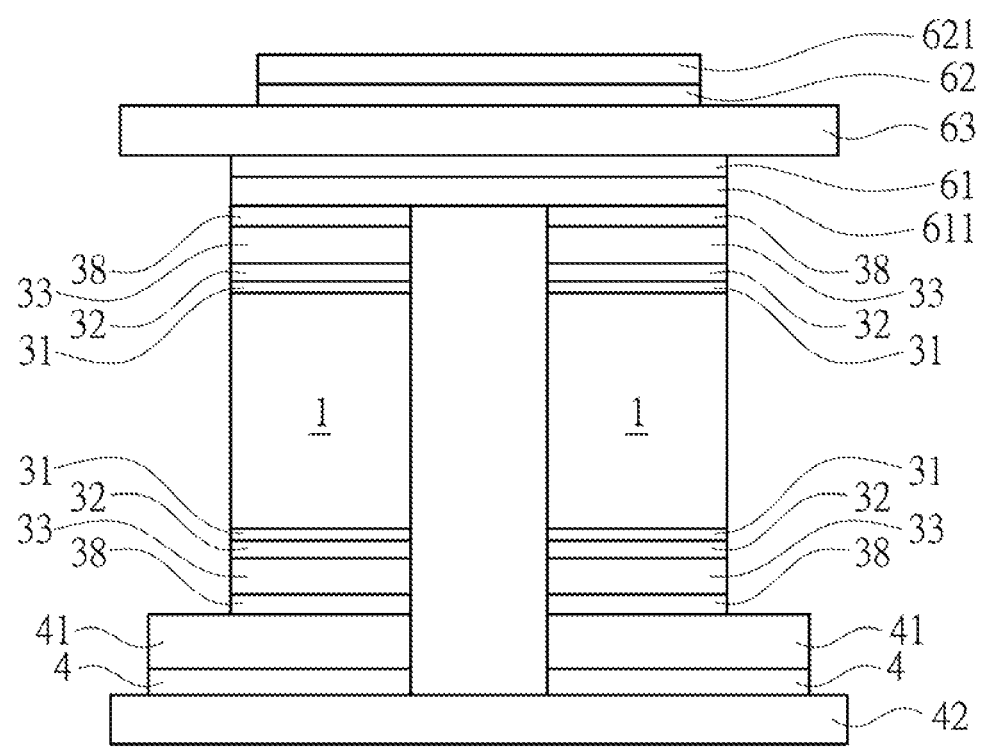

Then, a heating step is conducted under vacuum or a protective atmosphere, in which the heating temperature can be between about 150-400° C.; the heating time can be between about 3-60 minutes; and the jointing pressure can be between about 3-20 MPa. The structure of a portion of the multi-layer thermoelectric module as shown in FIG. 10 is formed. In the heating step, the low melting-point metal layer 34 needs to be reacted completely to form an intermetallic compound layer 38.

Figure 11:
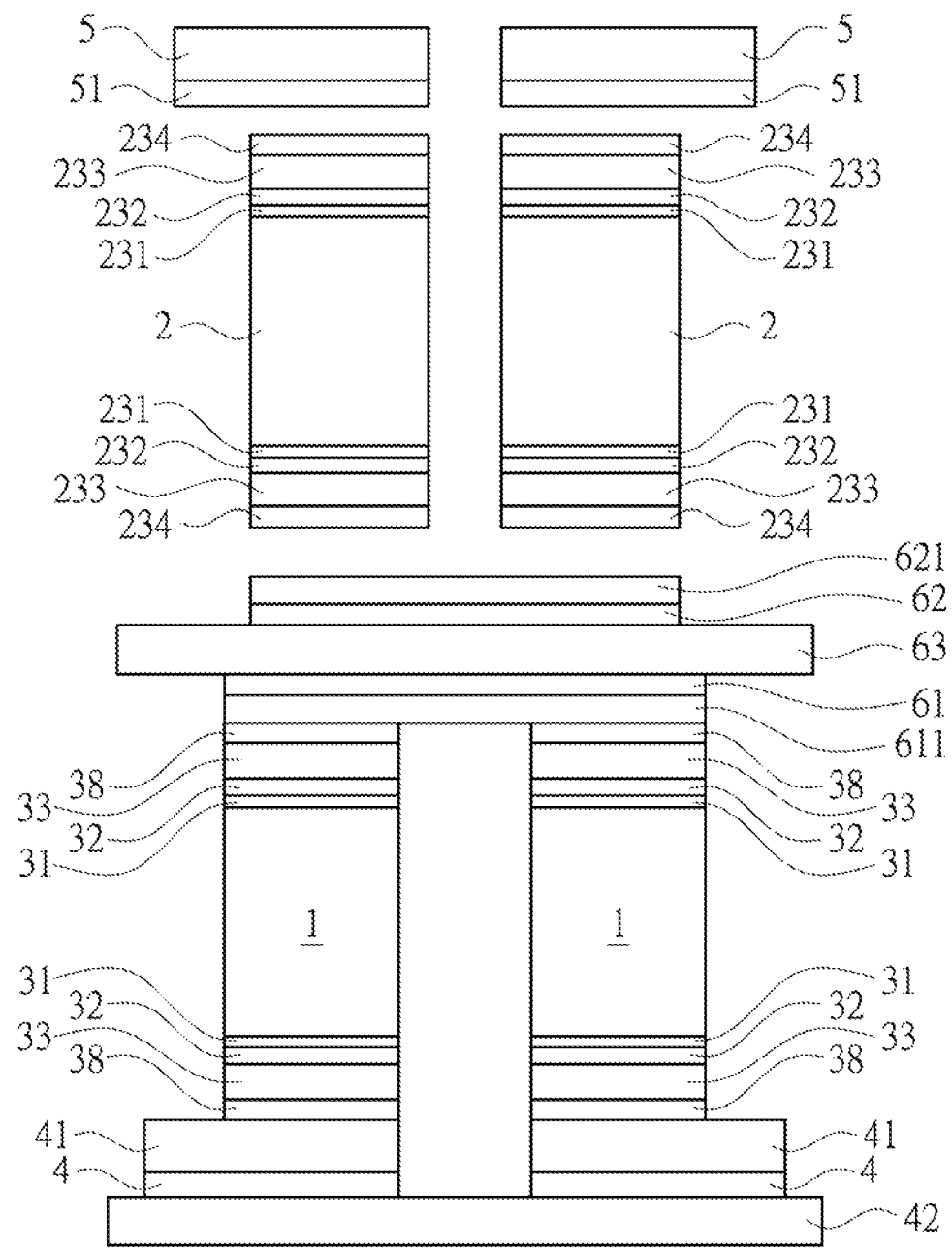

Then, as shown in FIG. 11, two thermoelectric units 2, two metal electrodes 5 are provided, and an interfacial adhesion layer 231, a diffusion barrier layer 232, a high melting-point metal layer 233 and a low melting-point metal layer 234 are formed sequentially on a surface of each thermoelectric unit 2. A high melting-point metal layer 51 is formed on a lower surface of each metal electrode 5. Then, the metal electrode 5, the thermoelectric unit 2 and a portion of the multi-layer thermoelectric module formed in previous paragraph are sequentially arranged in a multi-payer manner. Only one set of each of the thermoelectric units 1 and 2 and one set of each of the metal electrodes 4 or 5 also can be used in the second embodiment.

Figure 12:
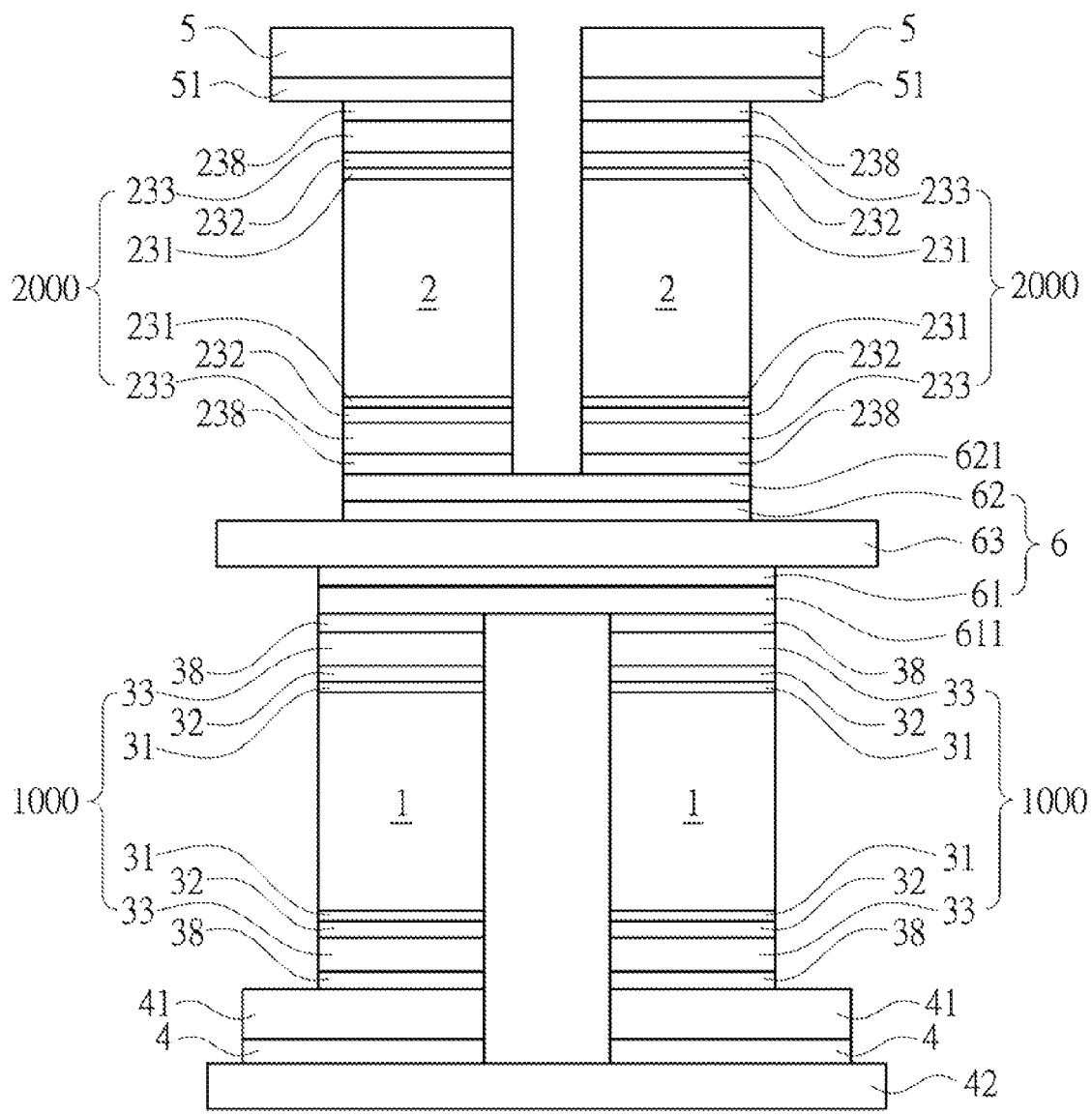

Then, a heating step is conducted under vacuum or a protective to atmosphere, in which the heating temperature can be between about 150-400° C., the heating time can be between about 3-60 minutes and the jointing pressure can be between about 3-20 MPa. The structure of the multi-layer thermoelectric module as shown in FIG. 12 is formed. Since the low melting-point metal layer 34 of the surface of thermoelectric unit 1 is completely consumed to form the intermetallic compound layer 38, and thus, in the heating step, the low melting-point metal layers 234 of the surface of thermoelectric unit 2 are reacted with the adjacent high melting-point metal layers 51, 233 and 621 to form intermetallic compound layers 238. The intermetallic compound layer 38 of the surface of the thermoelectric unit 1 will not be melted in the heating step. In brief, it is because the melting point of the intermetallic compound layer 38 or 238 formed from the heating step is higher than that of the low melting-point metal layer 34 or 234. Therefore, the multi-layer thermoelectric modules of embodiments can be formed in a fabricating process that has several steps, and the conventional problem of difficult process will not occur. Of course, the multi-layer thermoelectric modules of embodiments can be fabricated in one single heating step as illustrated in the first embodiment.

The multi-layer thermoelectric modules in the first and second embodiments mainly have two thermoelectric units 1 and 2. Generally speaking, the thermoelectric unit 1 or 2 has an appropriate thermoelectric conversion temperature, which the thermoelectric unit 1 or 2 can be corresponding to each operating temperature range. For instance, if the thermoelectric unit 1 or 2 is formed from $Bi_2Te_3$, PbTe, TAGS, $CoSb_3$ or SiGe, the preferred thermoelectric conversion temperatures thereof will be respectively at approximately 0° C.-120° C., 350° C.-600° C., 350° C.-550° C., 400° C.-550° C. or 700° C.-1000° C. In other words, the thermoelectric unit 1 or 2 used here can be formed from the materials with different thermoelectric conversion temperatures for improving the applicable temperature ranges of the multi-layer thermoelectric module. For example, in the case that the upper limit of the operating temperature range of the thermoelectric unit 2 is smaller than that of the thermoelectric unit 1, the thermoelectric unit 1 can be formed from GeTe or PbTe and the thermoelectric unit 2 can be formed from $Bi_{2(1-x)}Sb_{2x}Te_3$ or $Bi_2Te_{3(1-y)}Se_{3y}$, in which 0≤x≤0.75, where 0≤y≤0.2. Alternatively, the thermoelectric unit 1 can be formed from PbTe and the thermoelectric unit 2 can be formed from GeTe. Normally, PbTe is a high temperature thermoelectric material; GeTe is a moderate temperature thermoelectric material; and $Bi_{2(1-x)}Sb_{2x}Te_3$ or $Bi_2Te_{3(1-y)}Se_{3y}$, is a low temperature thermoelectric material.

Certainly, the multi-layer thermoelectric modules of the embodiments may include three or more thermoelectric element sets. Respective high melting-point metal layers on the three or more thermoelectric element sets can be jointed with the high melting-point metal layers on each metal electrode by each intermetallic compound layer. Besides, the selected materials, thickness or methods of the interfacial adhesion layer 231, the diffusion barrier layer 232, the high melting-point metal layer 233 and the low melting-point metal layer 234 are similar to those of the first embodiment and the second embodiment, and thus are not described again herein.

Further, in the selected high melting-point metal layer, the melting point thereof is higher than the upper limit of thermoelectric unit 1 or 2. Therefore, when in a practical operation, the multi-layer thermoelectric module of the embodiment can avoid the problem of lower power generation efficiency caused by the melted high melting-point metal layer.

Figure 13:
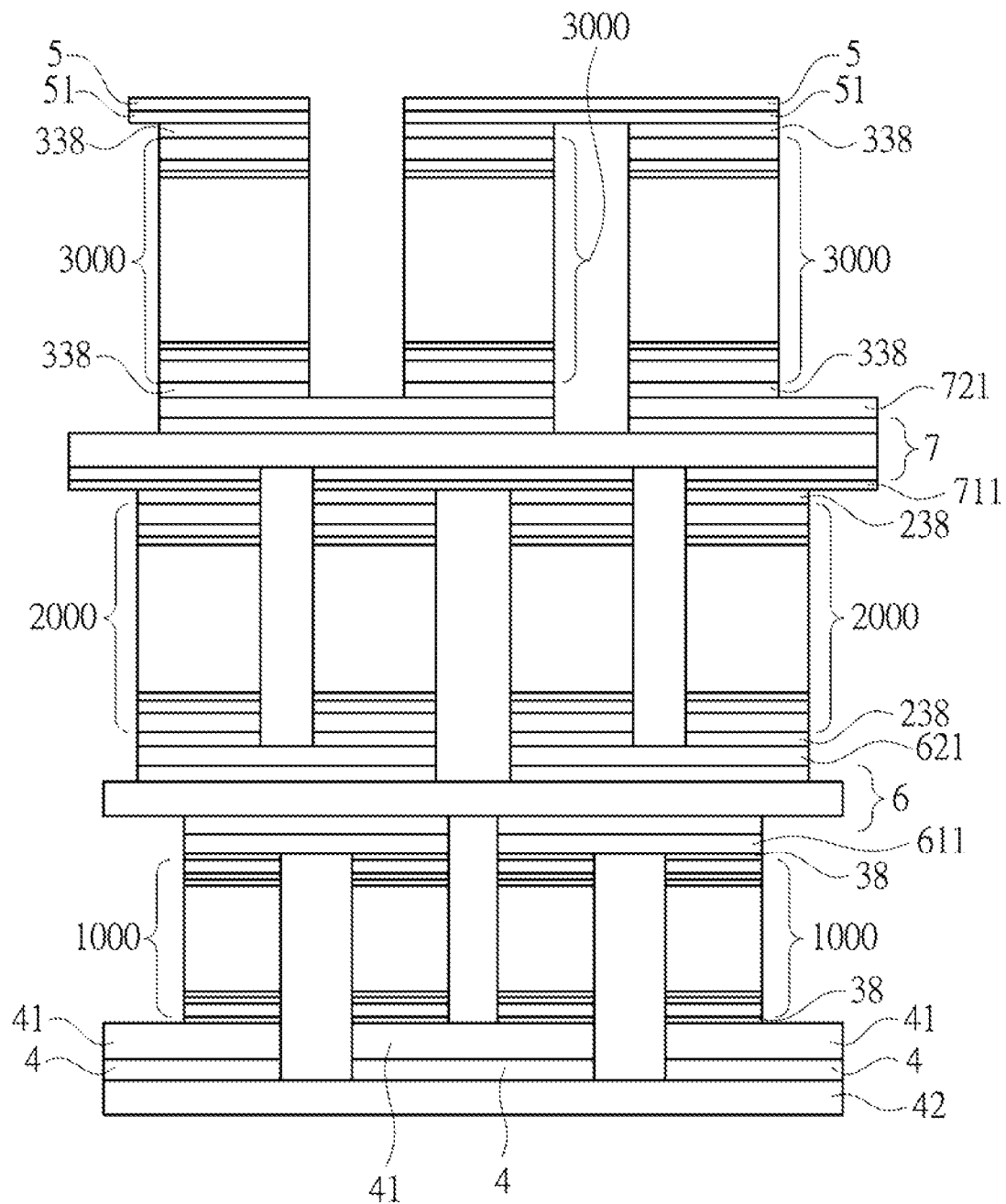
FIG. 13 is a schematic cross-sectional view of a multi-layer thermoelectric module in accordance with a third embodiment of the present invention.
Figure 14:
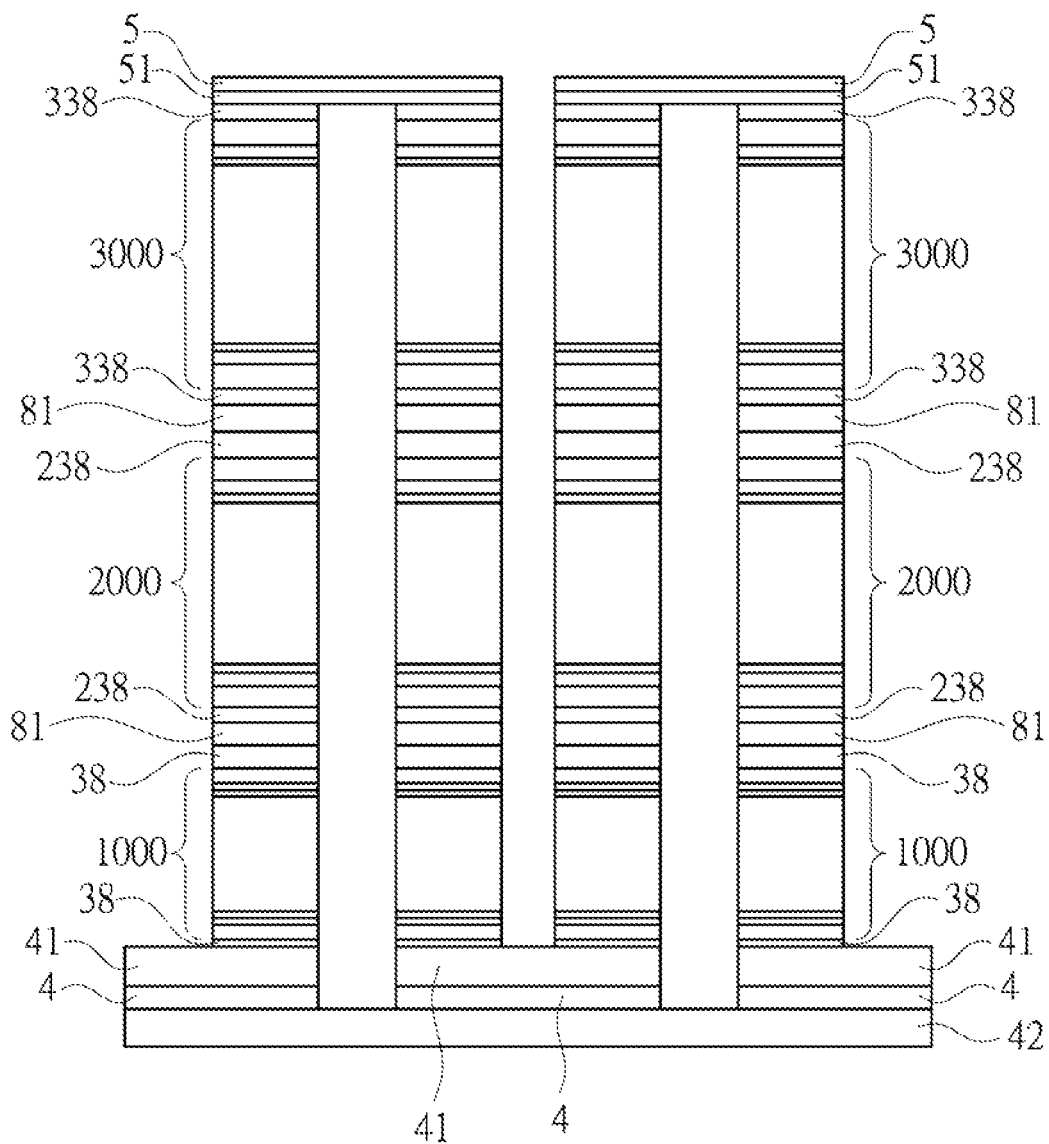
FIG. 14 is a schematic cross-sectional view of a multi-layer thermoelectric module in accordance with a fourth embodiment of the present invention.

Referring to FIG. 13 and FIG. 14, FIG. 13 and FIG. 14 are cross-sectional views of multi-layer thermoelectric modules in accordance with the third and fourth embodiments of the present invention. In the embodiments, the multi-layer thermoelectric module may have a plurality of sets of thermoelectric element sets 1000, 2000 and 3000, high melting-point metal layers 41, 51, 611, 621, 711 and 721, metal electrodes 4 and 5 and metal electrode sets 6 and 7, in which the metal electrode 4 may be formed on an insulating substrate 42, and their connecting methods are different in the third and fourth embodiments. In the third embodiment, a high melting-point metal layer 38 of the thermoelectric element set 1000 is jointed with the high melting-point metal layers 41 and 611; a high melting-point metal layer 238 of the thermoelectric element set 2000 is jointed with the high melting-point metal layer 621 and 711; and a high melting-point metal layer 338 of the thermoelectric element set 3000 is jointed with the high melting-point metal layers 51 and 721. Each of the thermoelectric element sets 1000, 2000 and 3000 is separated by an insulating substrate. Alternatively, in the fourth embodiment, a plurality of thermoelectric element sets are connected in series at one heating step, in which the intermetallic compound layers 38 is used to joint the thermoelectric element set 1000 with the high melting-point metal layer 41 and a high melting-point metal layer 81 between the thermoelectric element sets 1000 and 2000; the intermetallic compound layers 238 is used to joint the thermoelectric element set 2000 with the high melting-point metal layers 81 respectively between the thermoelectric element sets 1000 and 2000 and between the thermoelectric element sets 2000 and 3000; and the intermetallic compound layers 338 is used to joint the thermoelectric element set 3000 with the high melting-point metal layer 51 and the high melting-point metal layer 81 between the thermoelectric element sets 2000 and 3000.

Further, it is noted that a soldering technique may be simultaneously used when a metal electrode is connected in the multi-layer thermoelectric modules of embodiments. For example, when a thermoelectric unit suitable for use in low temperature is connected, the soldering technique can be used.

Figure 15:
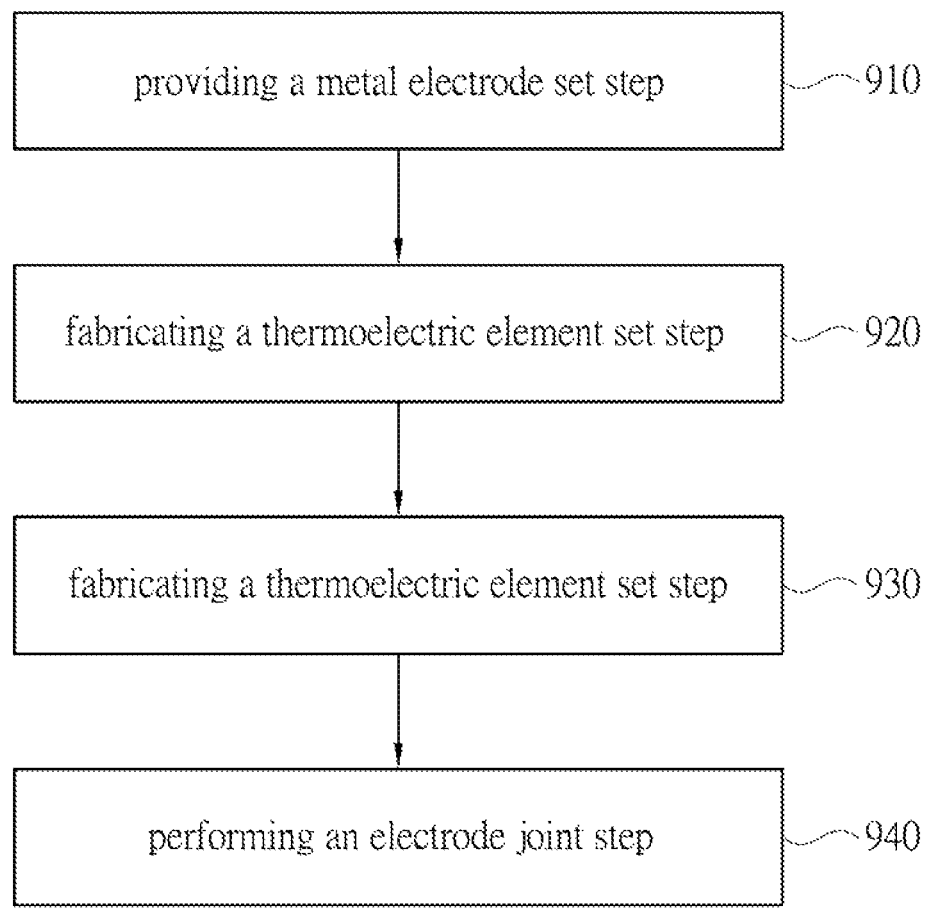
FIG. 15 is a flow chart showing a method for fabricating a multi-layer thermoelectric module in accordance with various embodiments of the present invention.

For clarity, FIG. 15 is a flow chart showing a method for fabricating a multi-layer thermoelectric module in accordance with various embodiments of the present invention. In the method for fabricating a multi-layer thermoelectric module 900, at first, at step 910, a metal electrode set 6 is provided. A fabricating step 920 is performed for fabricating a thermoelectric element set 1000. In the fabricating step 920, a thermoelectric unit 1 is provided; an interfacial adhesion layer 31 is formed on the thermoelectric unit 1; a diffusion barrier layer 32 is formed on the interfacial adhesion layer 31; and a high melting-point metal layer 33 is formed on the diffusion barrier layer 32, as shown in FIG. 1 to FIG. 5. Thus, the thermoelectric element set 1000 is formed.

Then, a fabricating step 930 is performed for fabricating a thermoelectric element set 2000. In the fabricating step 930, a thermoelectric unit 2 is provided; an interfacial adhesion layer 231 is formed on the thermoelectric unit 2; a diffusion barrier layer 232 is formed on the interfacial adhesion layer 231; and a high melting-point metal layer 233 is formed on the diffusion barrier layer 232. Thus, the thermoelectric element set 2000 is formed.

Then, an electrode joint step 940 is performed for jointing the thermoelectric element set 1000 and the thermoelectric element set 2000 respectively with a metal electrode 61 and a metal electrode 62 of the metal electrode set 6, as shown in FIG. 6. A solid-liquid jointing step is performed for jointing the high melting-point metal layer 33 of the thermoelectric element set 1000 with a high melting-point metal layer 611 and jointing the high melting-point metal layer 233 of the thermoelectric element set 2000 with a high melting-point metal, layer 621, as shown in FIG. 7.

In the solid-liquid jointing step, at first, a low melting-point metal layer 34 is reacted with the high melting-point metal layer 33 and a high melting-point metal layer 611 to produce an intermetallic compound layer 38 to joint the high melting-point metal layer 33 with the high melting-point metal layer 611, in which the low melting-point metal layer 34 is completely consumed. Then, a low melting-point metal layer 234 is reacted with the high melting-point metal layer 233 and the high melting-point metal layer 621 to produce an intermetallic compound layer 238 to joint the high melting-point metal layer 233 with the high melting-point metal layer 621, in which the low melting-point metal layer 234 is completely consumed, as shown in FIG. 8. Thus, the method for fabricating a multi-layer thermoelectric module can be used to fabricate a robust multi-layer thermoelectric module.

According to the above, the multi-layer thermoelectric modules and the method for fabricating the multi-layer thermoelectric modules, according to the embodiments, mainly use the low melting-point metal layer reacted with the high melting-point metal layer to form the intermetallic compound layer, so as to joint the respective high melting-point metal layers on the thermoelectric element set and the metal electrode by the intermetallic compound layer. Therefore, in the multi-layer thermoelectric module, the thermoelectric unit can be connected to the metal electrode in a heating step at a low temperature. After the multi-layer thermoelectric module is formed, it is suitable for use in a high temperature range, thus reducing the problem of the thermal stress caused by fabricating the multi-layer thermoelectric module, and increasing the operating temperature range of the multi-layer thermoelectric module.

Further, the method for fabricating the multi-layer thermoelectric modules, according to the embodiments, can avoid thermal stress damage caused by the conventional brazing method by using the same process temperature as a common soldering temperature. The low melting-point film used in the process is completely converted to the intermetallic compound layer. The intermetallic compound layer has an extremely high melting point, and the low melting-point metal film has been consumed completely in the heating step. Therefore, after cooling, the fabricated thermoelectric module can be used at a temperature higher than an operating temperature of the product fabricated by the soldering process or even the brazing process, which is different from the conventional soldering technique. That is, the thermoelectric module of the present invention has both advantages of "low temperature jointing" of the soldering method and "high operating temperature" of brazing method, thus avoiding the limitation of the operating temperature of a soldering module and the high temperature damage to a brazing module. Furthermore, the method for fabricating the multi-layer thermoelectric module according to the embodiments of the present invention can complete a two-layer or even three-layer thermoelectric module in one single heating step. It is difficult for the conventional soldering and brazing methods to form a plurality of layers in one single heating step, and thus the brazing method is first applied to a first layer of thermoelectric module first, and then the soldering method is applied to a second or third layer of thermoelectric module. Compared to the conventional soldering or brazing method, the method for fabricating the multi-layer thermoelectric module according to the embodiments of the present invention has an advantage of the production efficiency, thus lowering the production cost; and an advantage of cost competition, because the interfacial metal filler is a film which results in a very small amount of material consumption.

Although the present invention has been described above as in detailed description, it is not used to limit the present invention. It will be intended to those skilled in the art that various modifications and variations can be made to the structure of the present invention without departing from the scope or spirit of the invention. Therefore, the scope of the invention is to be defined solely by the appended claims.

What is claimed is:

1. A method for fabricating a multi-layer thermoelectric module, the method comprising:
   providing a metal electrode set;
   conducting a first fabricating step for fabricating a first thermoelectric element set, wherein the first fabricating step comprises:
   providing a first thermoelectric unit, wherein the first thermoelectric unit is corresponding to a first operating temperature range;
   forming a first interfacial adhesion layer on the first thermoelectric unit;
   forming a first diffusion barrier layer on the first interfacial adhesion layer;

forming a first high melting-point metal layer on the first diffusion barrier layer for forming the first thermoelectric element set, wherein a melting point of the first high melting-point metal layer is higher than an upper limit of the first operating temperature range;

conducting a second fabricating step for fabricating a second thermoelectric element set, wherein the second fabricating step comprises:

providing a second thermoelectric unit, wherein the second thermoelectric unit is corresponding to a second operating temperature range, wherein an upper limit of the second operating temperature range is smaller than the upper limit of the first operating temperature range;

forming a second interfacial adhesion layer on the second thermoelectric unit;

forming a second interfacial adhesion layer on the second interfacial adhesion layer;

forming a second high melting-point metal layer on the second diffusion barrier layer for forming the second thermoelectric element set, wherein a melting point of the second high melting-point metal layer is higher than the upper limit of the first operating temperature range;

conducting an electrode joint step for jointing the first thermoelectric element set and the second thermoelectric element set respectively with the metal electrode set, wherein the electrode joint step comprises:

forming a third high melting-point metal layer on an upper surface of the metal electrode set;

forming a fourth high melting-point metal layer on a lower surface of the metal electrode set;

conducting a solid-liquid jointing step for jointing the first high melting-point metal layer of the first thermoelectric element set with the third high inciting-point metal layer and jointing the second high melting-point, metal layer of the second thermoelectric element set with the fourth high melting-point metal layer, wherein the solid-liquid jointing step comprises:

utilizing a first low melting-point metal layer to react with the first high melting-point metal layer and the third high melting-point metal layer for producing a first intermetallic compound layer to joint the first high melting-point metal layer with the third high melting-point metal layer, the first low melting-point metal layer consumed completely, wherein a melting point of the first low melting-point metal layer is lower than the upper limit of the first operating temperature range; and utilizing a second low melting-point metal layer to react with the second high melting-point metal layer and the fourth high melting-point metal layer for producing a second intermetallic compound layer to joint the second high melting-point metal layer with the fourth high melting-point metal layer, the second low melting-point metal layer consumed completely, wherein the melting point of the second low melting-point metal layer is lower than the upper limit of the first operating temperature range.

2. The method of claim 1, wherein the first thermoelectric unit is formed from GeTe or PbTe, the second thermoelectric unit is formed from $Bi_{2(1-x)}Sb_{2x}Te_3$ or $Bi_2Te_{3(1-y)}Se_{3y}$, wherein $0 \leq x \leq 0.75$, where $0 \leq y \leq 0.2$; the first interfacial adhesion layer is formed from a compound of Sn and the first thermoelectric unit; and the second interfacial adhesion layer is formed from a compound of Sn and the second thermoelectric unit.

3. The method of claim 1, wherein the first thermoelectric unit is formed from PbTe; the second thermoelectric unit is formed from GeTe; the first interfacial adhesion layer is formed from a compound of Sn and the first thermoelectric unit; and the second interfacial adhesion layer is formed from a compound of Sn and the second thermoelectric unit.

4. The method of claim 2, wherein the first diffusion barrier layer and the second diffusion barrier layer is formed from Ni; the first high melting-point metal layer and the second high melting-point metal layer are formed from Ag; and the first low melting-point metal layer and the second low melting-point metal layer are Sn, In or Indium-Tin alloy.

5. The method of claim 3, wherein the first diffusion barrier layer and the second diffusion barrier layer is formed from Ni; the first high melting-point, metal layer and the second high melting-point metal layer are formed from Ag; and the first low melting-point metal layer and the second low melting-point metal layer are Sn, In or Indium-Tin alloy.

6. The method of claim 1, wherein the third high melting-point metal layer and the fourth high melting-point metal layer are formed from Ag.

* * * * *